(12) United States Patent
Deshmukh et al.

(10) Patent No.: US 12,038,855 B2
(45) Date of Patent: Jul. 16, 2024

(54) MEMORY SYSTEM WITH ADAPTIVE REFRESH

(71) Applicant: QUALCOMM Incorporated, San Diego, CA (US)

(72) Inventors: Pankaj Deshmukh, San Diego, CA (US); Shyamkumar Thoziyoor, San Diego, CA (US); Vishakh Balakuntalam Visweswara, Vancouver (CA); Jungwon Suh, San Diego, CA (US); Subbarao Palacharla, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 89 days.

(21) Appl. No.: 17/650,455

(22) Filed: Feb. 9, 2022

(65) Prior Publication Data
US 2023/0305971 A1   Sep. 28, 2023

(51) Int. Cl.
*G06F 13/16* (2006.01)

(52) U.S. Cl.
CPC .................... *G06F 13/1668* (2013.01)

(58) Field of Classification Search
None
See application file for complete search history.

(56) References Cited

U.S. PATENT DOCUMENTS

| | | | |
|---|---|---|---|
| 9,042,194 B2 | 5/2015 | Park et al. | |
| 10,162,522 B1* | 12/2018 | Li | G06F 13/1689 |
| 11,610,624 B2 | 3/2023 | Kim et al. | |
| 11,735,246 B2 | 8/2023 | Hatakeyama et al. | |
| 2002/0126560 A1* | 9/2002 | Cowles | G11C 11/406 365/222 |
| 2016/0254044 A1* | 9/2016 | Bains | G11C 11/4087 365/203 |
| 2018/0053569 A1* | 2/2018 | Xiao | G11C 29/783 |
| 2018/0373313 A1* | 12/2018 | Hasbun | G06F 1/3275 |
| 2019/0043552 A1* | 2/2019 | Alameer | G06F 12/08 |
| 2020/0066328 A1* | 2/2020 | Fu | G06F 13/10 |
| 2020/0211633 A1* | 7/2020 | Okuma | G06F 12/0646 |
| 2022/0051716 A1* | 2/2022 | Ayyapureddi | G06F 13/1636 |

(Continued)

OTHER PUBLICATIONS

International Search Report and Written Opinion for International Patent Application No. PCT/US2023/060624, mailed Apr. 12, 2023, 14 pages.

*Primary Examiner* — Hyun Nam
(74) *Attorney, Agent, or Firm* — W&T/Qualcomm

(57) ABSTRACT

A memory system with adaptive refresh commands is disclosed. In one aspect, a memory system or device that has multiple banks within a channel may receive a per bank command that indicates a first bank to be refreshed and provides additional information about a second bank to be refreshed. In a further exemplary aspect, a quad bank refresh command may be sent that indicates a first bank to be refreshed and provides additional information about second through fourth banks to be refreshed. In a further exemplary aspect, an octa bank refresh command may be sent that indicates a first bank to be refreshed and provides additional information about second through eighth banks to be refreshed. The three new refresh commands allow adjacent or spaced banks to be refreshed.

17 Claims, 16 Drawing Sheets

(56) References Cited

U.S. PATENT DOCUMENTS

| | | | |
|---|---|---|---|
| 2022/0107905 A1* | 4/2022 | Bell | G11C 11/4096 |
| 2022/0189527 A1* | 6/2022 | Kim | G11C 11/40603 |
| 2023/0060358 A1 | 3/2023 | Hong et al. | |
| 2023/0205712 A1* | 6/2023 | Prather | G06F 11/0787 |
| | | | 711/154 |
| 2023/0305971 A1* | 9/2023 | Deshmukh | G11C 11/40611 |

* cited by examiner

MEMORY SYSTEM WITH ADAPTIVE REFRESH

BACKGROUND

I. Field of the Disclosure

The technology of the disclosure relates generally to memory systems and particularly to refreshing transistor cells in memory systems.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. Access to such functionality is usually dependent on having a memory system interoperate with a control system to store instructions and data. One popular format of memory is the low power double data rate (LPDDR) synchronous dynamic random access memory (SDRAM) standard. JEDEC is the standards setting body for LPDDR and has promulgated various versions of the standard, with LPDDR5 updated in June of 2021. The existence of such standards provides opportunities for improvements and innovation, and such innovation may be used in extant standards or prospective standards or other implementations.

SUMMARY

Aspects disclosed in the detailed description include a memory system with adaptive refresh. In an exemplary aspect, a memory system or device that has multiple banks within a channel may receive a per bank command that indicates a first bank to be refreshed and provides additional information about a second bank to be refreshed. In a further exemplary aspect, a quad bank refresh command may be sent that indicates a first bank to be refreshed and provides additional information about second through fourth banks to be refreshed. In a further exemplary aspect, an octa bank refresh command may be sent that indicates a first bank to be refreshed and provides additional information about second through eighth banks to be refreshed. The three new refresh commands allow adjacent or spaced banks to be refreshed, which allows greater flexibility in arranging bank refreshes without stalling traffic into or from other banks in the memory device. Such flexibility improves refresh performance and may reduce latency when using the memory device.

In this regard in one aspect, a memory device is disclosed. The memory device includes a memory block. The memory device also includes a memory bus interface configured to receive a refresh command from a remote source over a memory bus. The refresh command includes a first address within the memory block. The refresh command also includes additional information that indicates to the memory device a second address within the memory block.

In another aspect, a memory controller is disclosed. The memory controller includes a bus interface. The bus interface is configured to couple to a memory bus. The bus interface is also configured to send a refresh command to a memory device through the memory bus. The refresh command includes a first address within a memory block within the memory device. The refresh command also includes additional information that indicates to the memory device a second address within the memory block.

In another aspect, a memory device is disclosed. The memory device includes a memory block. The memory device also includes a memory bus interface configured to receive a quad refresh command from a remote source over a memory bus. The quad refresh command includes a first address within the memory block. The quad refresh command also includes additional information that indicates to the memory device at least second through fourth addresses within the memory block.

In another aspect, a memory device is disclosed. The memory device includes a memory block. The memory device also includes a memory bus interface configured to receive an octa refresh command from a remote source over a memory bus. The octa refresh command includes a first address within the memory block. The octa refresh command also includes additional information that indicates to the memory device at least second through eighth addresses within the memory block.

In another aspect, a memory controller is disclosed. The memory controller includes a bus interface. The bus interface is configured to couple to a memory bus. The bus interface is also configured to send a quad refresh command to a memory device through the memory bus. The quad refresh command includes a first address within a memory block. The quad refresh command also includes additional information that indicates to the memory device at least second through fourth addresses within the memory block.

In another aspect, a memory controller is disclosed. The memory controller includes a bus interface. The bus interface is configured to couple to a memory bus. The bus interface is also configured to send an octa refresh command to a memory device through the memory bus. The octa refresh command includes a first address within a memory block. The octa refresh command also includes additional information that indicates to the memory device at least second through eighth addresses within the memory block.

In another aspect, a method for a memory device to refresh memory cells is disclosed. The method includes receiving a refresh command through a bus interface coupled to a memory bus. The refresh command includes a first address within a memory block. The refresh command also includes additional information that indicates to the memory device a second address within the memory block.

In another aspect, a method for a memory controller to refresh memory cells is disclosed. The method includes sending a refresh command through a bus interface coupled to a memory bus. The refresh command includes a first address within a memory block. The refresh command also includes additional information that indicates to a memory device a second address within the memory block.

DETAILED DESCRIPTION

Figure 1:
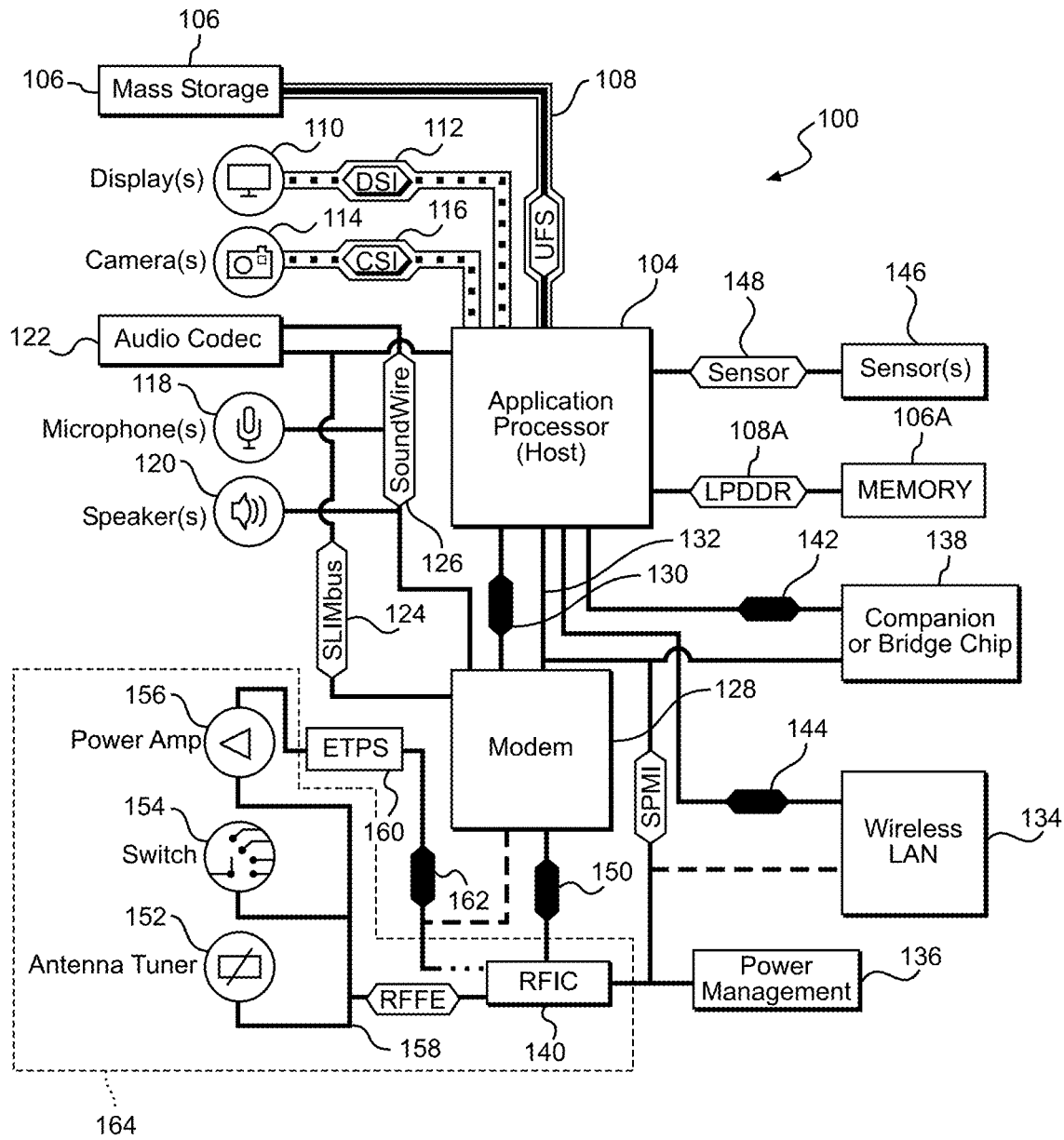
FIG. 1 is a block diagram of an exemplary mobile computing device that may include memory elements that operate according to a JEDEC memory standard.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a memory system with adaptive refresh. In an exemplary aspect, a memory system or device that has multiple banks within a channel may receive a per bank command that indicates a first bank to be refreshed and provides additional information about a second bank to be refreshed. In a further exemplary aspect, a quad bank refresh command may be sent that indicates a first bank to be refreshed and provides additional information about second through fourth banks to be refreshed. In a further exemplary aspect, an octa bank refresh command may be sent that indicates a first bank to be refreshed and provides additional information about second through eighth banks to be refreshed. The three new refresh commands allow adjacent or spaced banks to be refreshed, which allows greater flexibility in arranging bank refreshes without stalling traffic into or from other banks in the memory device. Such flexibility improves refresh performance and may reduce latency when using the memory device.

Figure 4A:
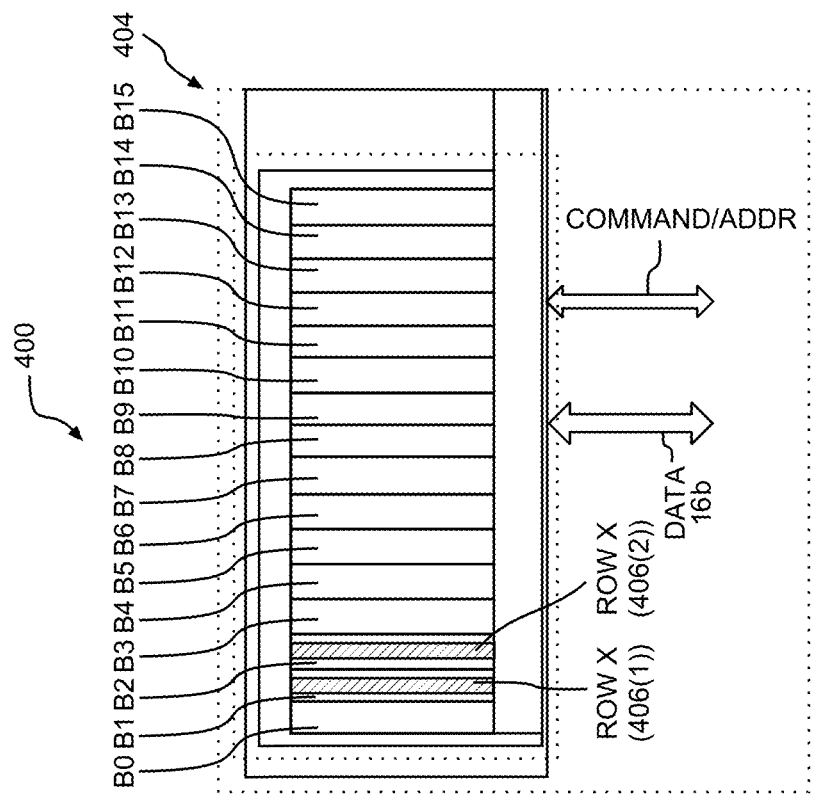
FIG. 4A is a block diagram of an exemplary aspect of a modified per bank refresh command in a one-channel memory structure according to an exemplary aspect of the present disclosure.

Before addressing exemplary aspects of the present disclosure, an overview of a computing device that may include memory systems that may benefit from the present disclosure is provided followed by an overview of the limitations of JEDEC's low power double data rate (LPDDR) so that the advantages of the present disclosure are highlighted beginning with reference to FIG. 4A. While well suited for use with existing and emerging LPDDR standards, it should be appreciated that other memory systems may also benefit from the present disclosure and the disclosure is not limited to LPDDR devices.

As an initial bit of nomenclature, it should be appreciated that double data rate (DDR) is a term of art within the JEDEC specifications and the memory world in general. As used herein, DDR is defined to be a signaling technique that uses both the falling and rising edges of the clock signal. This use of both edges is independent of frequency, and changes (e.g., doubling) in frequency do not fall within DDR unless both edges are used. Also contrast DDR with single data rate (SDR) which can transfer data on a rising edge or a falling edge, but not both.

FIG. 1 is a system-level block diagram of an exemplary mobile terminal 100 such as a smart phone, mobile computing device tablet, or the like. While a mobile terminal having a LPDDR bus is particularly contemplated as being capable of benefiting from exemplary aspects of the present disclosure, it should be appreciated that the present disclosure is not so limited and may be useful in any system having comparable memory buses.

With continued reference to FIG. 1, the mobile terminal 100 includes an application processor 104 (sometimes referred to as a host or system on a chip SoC) that communicates with a mass storage element 106 through a universal flash storage (UFS) bus 108. Additionally, the application processor 104 may communicate with a memory device 106A through an LPDDR bus 108A. While it is particularly contemplated that exemplary aspects of the present disclosure apply to LPDDR version 5 (i.e., LPDDR5) and other emerging memory standards, the present disclosure is not so limited and may apply to other memory buses. It should be appreciated that the application processor 104 includes a bus interface configured to interoperate with the memory buses of the present disclosure such as the LPDDR bus 108A. Additionally, there may be a memory controller circuit (not shown) within the application processor 104 that implements aspects of the present disclosure. Likewise, the memory device 106A may have a bus interface and some form of control circuit that processes commands received from the LPDDR bus 108A and accesses memory cells within the memory device 106A.

The application processor 104 may further be connected to a display 110 through a display serial interface (DSI) bus 112 and a camera 114 through a camera serial interface (CSI) bus 116. Various audio elements such as a microphone 118, a speaker 120, and an audio codec 122 may be coupled to the application processor 104 through a serial low-power inter-chip multimedia bus (SLIMbus) 124. Additionally, the audio elements may communicate with each other through a SOUNDWIRE bus 126. A modem 128 may also be coupled to the SLIMbus 124 and/or the SOUNDWIRE bus 126. The modern 128 may further be connected to the application processor 104 through a peripheral component interconnect (PCI) or PCI express (PCIe) bus 130 and/or a system power management interface (SPMI) bus 132.

With continued reference to FIG. 1, the SPMI bus 132 may also be coupled to a local area network (LAN or WLAN) integrated circuit (IC) (LAN IC or WLAN IC) 134, a power management integrated circuit (PMIC) 136, a companion IC (sometimes referred to as a bridge chip) 138, and a radio frequency IC (RFIC) 140. It should be appreciated that separate PCI buses 142 and 144 may also couple the application processor 104 to the companion IC 138 and the WLAN IC 134. The application processor 104 may further be connected to sensors 146 through a sensor bus 148. The modem 128 and the RFIC 140 may communicate using a bus 150.

With continued reference to FIG. 1, the RFIC 140 may couple to one or more RFFE elements, such as an antenna tuner 152, a switch 154, and a power amplifier 156 through a radio frequency front end (RFFE) bus 158. Additionally, the RFIC 140 may couple to an envelope tracking power supply (ETPS) 160 through a bus 162, and the ETPS 160 may communicate with the power amplifier 156. Collectively, the RFFE elements, including the RFIC 140, may be considered an RFFE system 164. It should be appreciated that the RFFE bus 158 may be formed from a clock line and a data line (not illustrated).

Figure 2A:
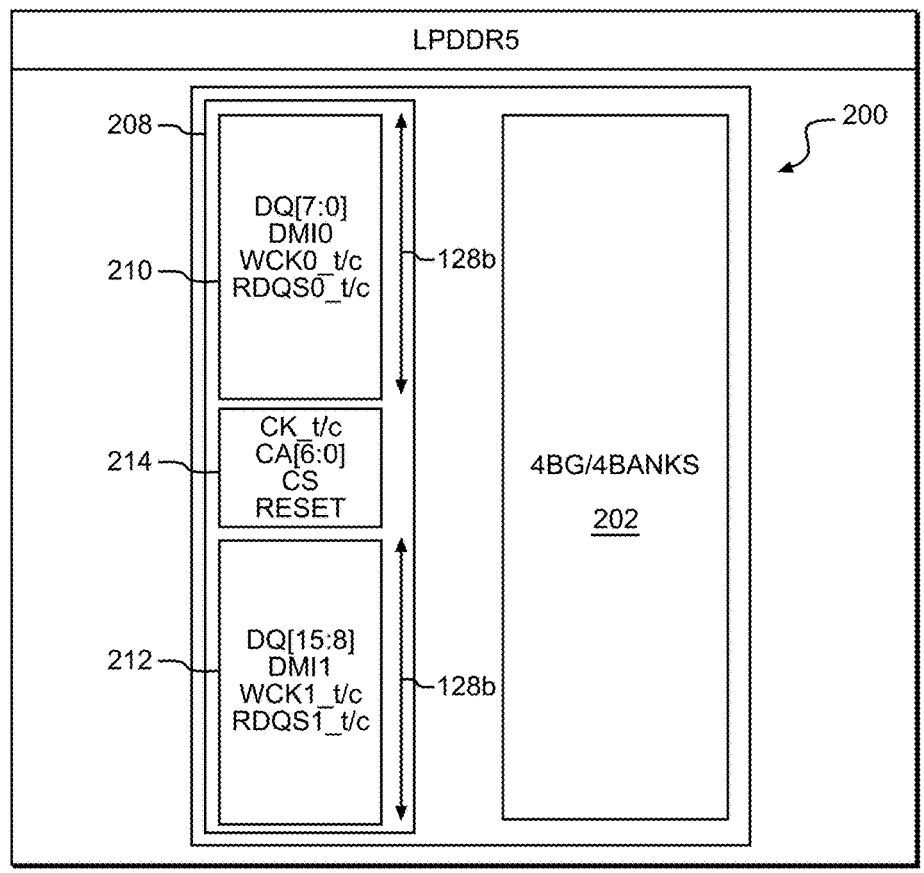
FIG. 2A is a block diagram of a memory device configured to comply with a low power double data rate (LPDDR) version 5 standard (LPDDR5)
Figure 2B:
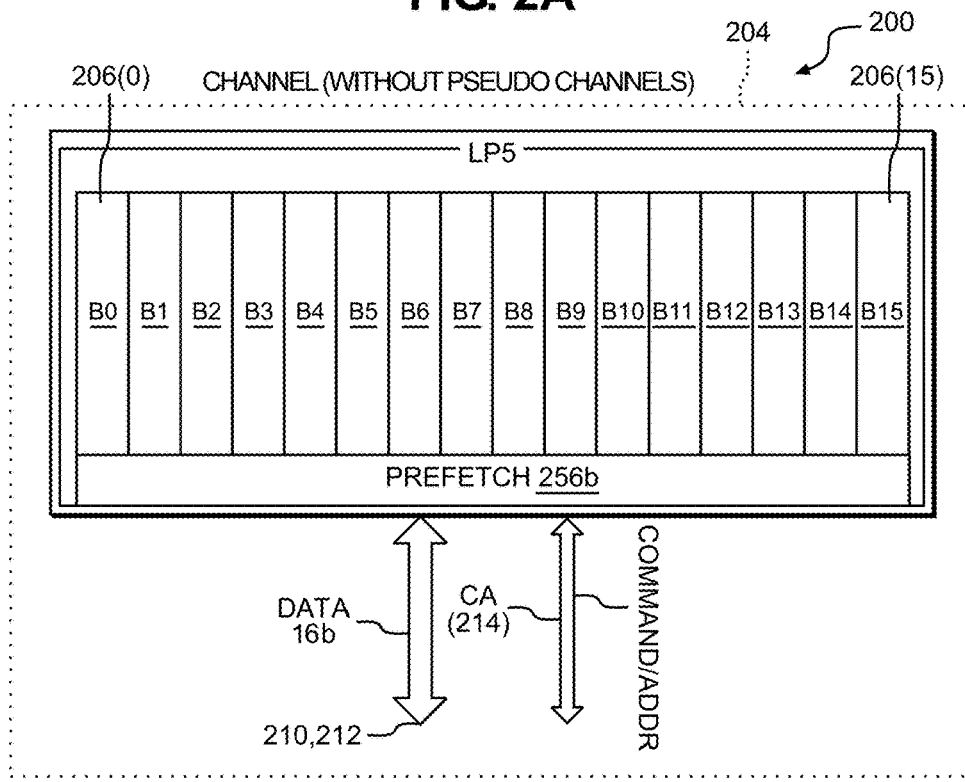
FIG. 2B is a block diagram of an LPDDR5 channel configuration showing how banks are arranged within the channel.

The LPDDR5 standard contemplates a memory die or memory device 200, illustrated in FIG. 2A that includes a memory block 202 having four bank groups (BG), each with four banks for a total of sixteen banks, which forms a channel 204 of banks 206(0)-206(15) (also B0-B15 as illustrated) as shown in FIG. 2B. The memory device 200 may include an interface 208 (FIG. 2A) that has a first eight DQ conductors (DQ[7:0]), a first data mask inversion conductor (DMI0), two conductors that form a first differential write clock (WCK), and a pair of conductors that form a first redundant data strobe (RDQS0) in a first group 210; and a second eight DQ conductors (DQ[15:8]), a second data mask inversion conductor (DMI1), two conductors that form a second differential write clock (WCK), and two conductors that form a second redundant data strobe (RDQS1) in a second group 212. The groups 210, 212 share a differential clock (CK), a command and address conductor(s) (CA[6:0]), a chip select conductor (CS), and a reset conductor (all shown in middle group 214). A typical LPDDR5 memory device 200 may have: a maximum bandwidth of 12.8 gigabytes per second (GB/s), an input/output speed of 6400 megabits per second (Mbps), a maximum CK frequency of 800 megahertz (MHz), a maximum WCK frequency of 3200 MHZ, a CA speed of 1600 megatransfers per second (MT/s), and operate on a non-return to zero (NRZ) signaling scheme.

In practice, the memory block 202 is formed of a variety of cells (e.g., a six-transistor (6T) cell). Each cell is expected to have a retention time of sixty-four milliseconds (64 ms), and thus, every cell must be refreshed within a 64 ms window. This refresh task is broken into equally-sized refresh operations, where each refresh operation takes approximately three hundred nanoseconds (300 ns). When a cell is being refreshed, it is not available to handle traffic (e.g., read or write commands). If a read or write command to a given cell occurs while the given cell is being refreshed, traffic to the cell may stall until refresh is complete, resulting in added latency. Such latency is generally undesirable.

Figure 2C:
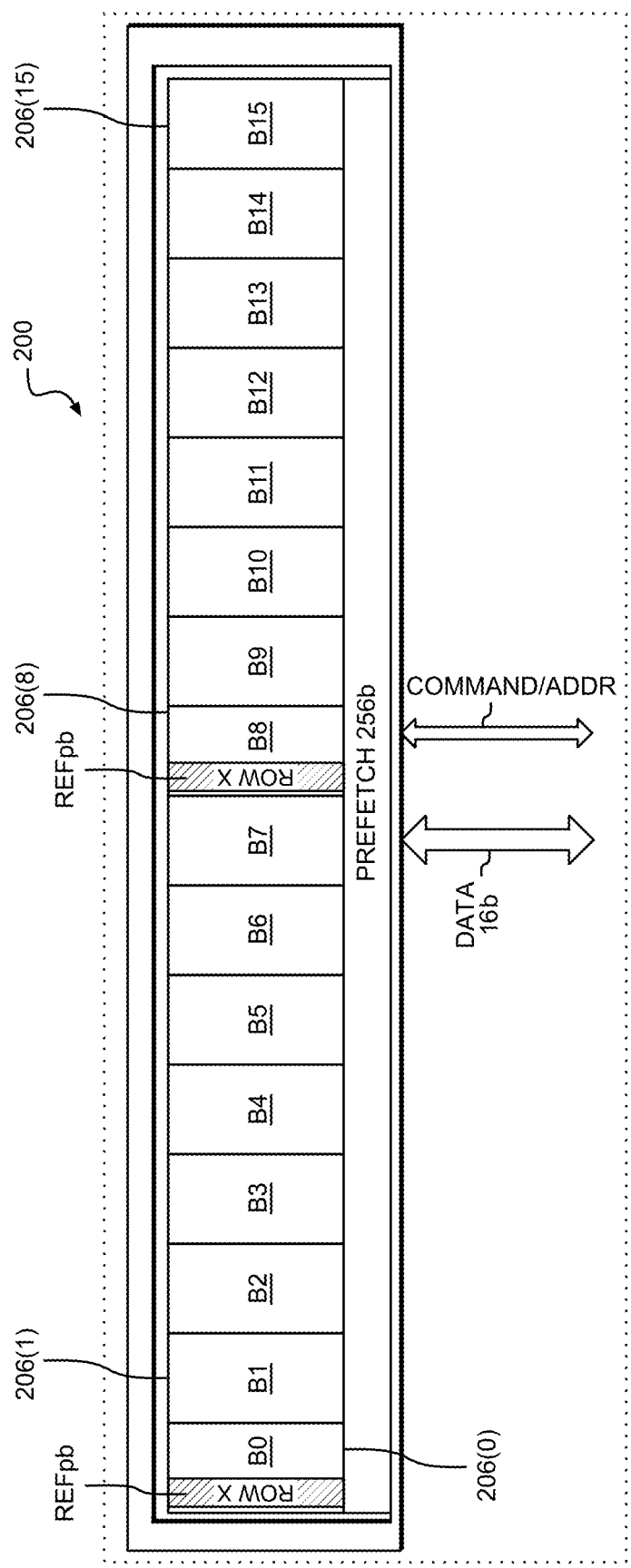
FIG. 2C is a block diagram of an LPDDR5 channel operating with a conventional per bank refresh command.

To speed up refresh operations, LPDDR5 introduced a per bank refresh (REFpb) command, better illustrated in FIG. 2C. A REFpb command can refresh two banks within banks 206(0)-206(15) concurrently. However, current limitations of the REFpb command require that the two banks be within different groups 210, 212 and that they be spaced eight banks apart. Thus, as illustrated, a REFpb command might refresh bank 206(0) and bank 206(8). While refreshing two banks concurrently does make it easier to perform a refresh for every cell within the window, this approach is not optimal. Specifically, there is no flexibility in the second bank to be refreshed. The second bank is always the eighth bank from the first bank (e.g., 0/8; 1/9; 2/10, etc.). If a read or write command is directed to either bank while it is being refreshed, the traffic may stall, adding latency resulting in a huge performance penalty.

Figure 3A:
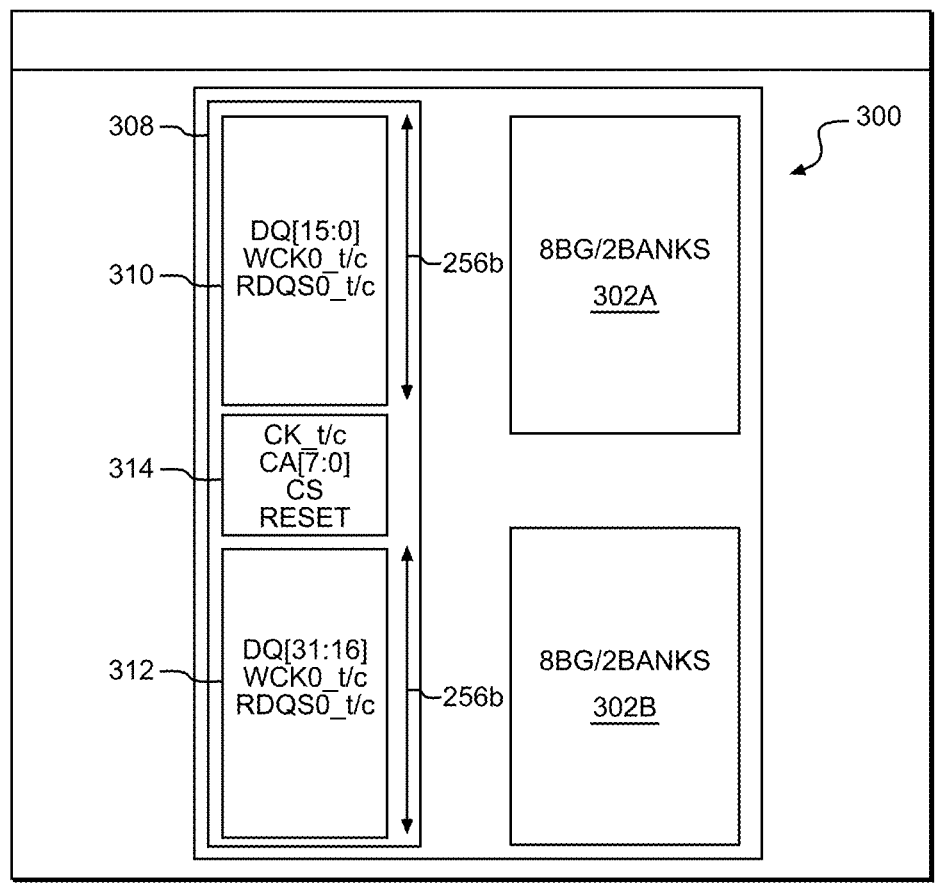
FIG. 3A is a block diagram of an improved memory device configuration
Figure 3B:
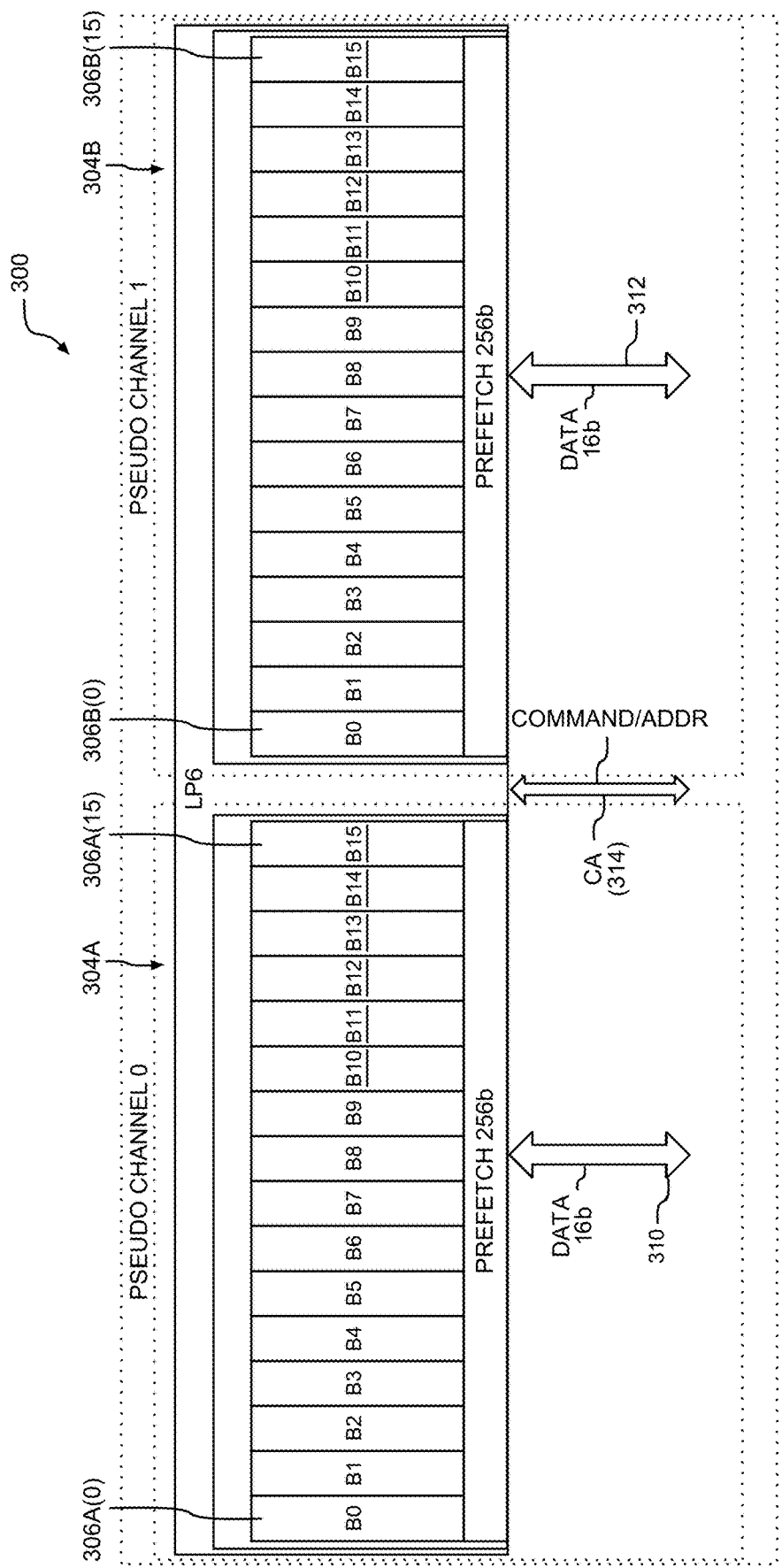
FIG. 3B is a block diagram of an improved memory channel configuration showing how banks are arranged within two pseudo-channels.
Figure 3C:
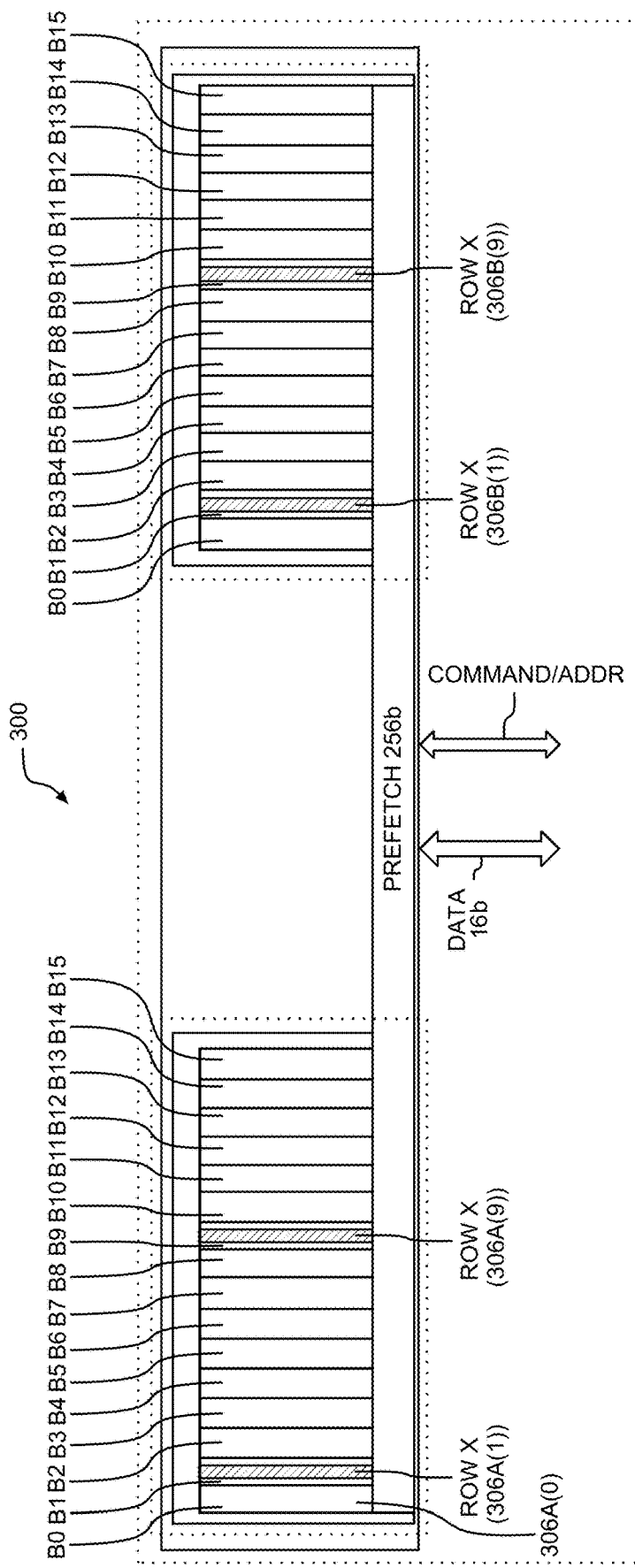
FIG. 3C is a block diagram of an improved memory channel operating with a per bank refresh command that complies with the LPDDR5 per bank refresh command.

An overview of an improved memory device 300 is illustrated in FIGS. 3A-3C, with the details corresponding to those presented in FIGS. 2A-2C. The exemplary improved memory configuration relies heavily on LPDDR5, and the REFpb command from LPDDR5 was preserved with similar deficiencies. In this regard, FIG. 3A illustrates the memory device 300 that has a first memory block 302A having eight bank groups (BG), each with two banks and a second memory block 302B also having eight bank groups (BG), each with two banks, for a total of thirty-two banks. The thirty-two banks are divided into two pseudo-channels 304A, 304B of banks 306A(0)-306A(15) and 306B(0)-306B(15), respectively, as shown in FIG. 3B. The memory device 300 may include an interface 308 (FIG. 3A) that has a first 12 DQ conductors (DQ[11:0]), two conductors that form a first differential write clock (WCK), and a pair of conductors that form a first redundant data strobe (RDQS0) in a first group 310; and a second twelve DQ conductors (DQ[23:12]), two conductors that form a second differential write clock (WCK), and two conductors that form a second redundant data strobe (RDQS1) in a second group 312. The groups 310, 312 share a differential clock (CK), seven command and address conductors (CA[7:0]), a chip select conductor (CS), and a reset conductor (all shown in middle group 314). The memory device(s) 300 may have: a maximum bandwidth of 25.6 GB/s, an input/output speed of 6400 Mbps, a maximum CK frequency of 1600 MHZ, a maximum WCK frequency of 3200 MHZ, a CA speed of 3200 MT/s, and operate on a pulse amplitude modulation (PAM) and/or a NRZ signaling scheme. It should be appreciated that the interface 308 is configured to receive commands and/or data from a remote source such, for example, the application processor 104.

As with the memory device 200, the memory device 300 may also need to refresh all rows in all the banks within a refresh window of 64 ms. Since there are now twice the number of banks, there is corresponding more time spent on refreshing banks. To offset this, the improved device configuration contemplates a REFpb command that operates on both pseudo-channels 304A and 304B concurrently while also refreshing two banks within each pseudo-channel 304A or 304B. Thus, the REFpb command, as illustrated in FIG. 3C may operate on bank 306A(1)/306A(9) and concurrently on bank 306B(1)/306B(9). This concurrent refresh does assist in getting all the refresh commands within the 64 ms window, but still suffers from the possibility of stalling traffic.

Figure 3D:
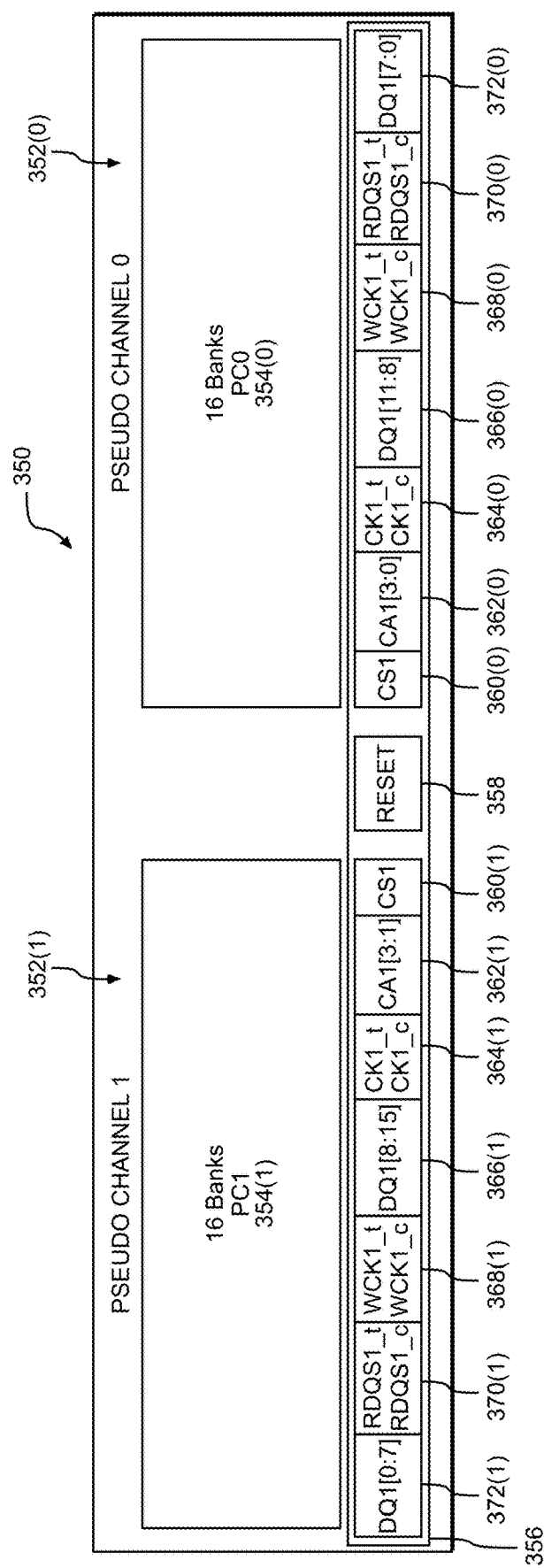
FIG. 3D is a block diagram of a memory device configured according to a second improved memory channel configuration.

While the memory device 300 is one possible implementation of an improved memory configuration, there are other architectures such as memory device 350 illustrated in FIG. 3D that may benefit from exemplary aspects of the present disclosure. The memory device 350 includes a first memory block 352(0) having sixteen banks and a second memory block 352(1) having sixteen banks, for a total of thirty-two banks. The thirty-two banks are divided into two pseudo-channels 354(0), 354(1). The pin/conductors of an interface 356 are somewhat different. Specifically, the conductors are mirrored around a central reset conductor 358 that is common to both pseudo-channels 354(0), 354(1). Each pseudo-channel 354(0), 354(1) includes a respective chip select conductor 360(0), 360(1) and four command and address conductors 362(0), 362(1) (CA0[3:0], CA1[3:0]). Additionally, a differential clock conductor 364(0), 364(1) (also referred to as CK0_t/c and CK1_t/c) may be provided to each pseudo-channel 354(0), 354(1). A first set of data channel conductors 366(0), 366(1) (DQ0[15:8], DQ1[8:15]) may be next. Breaking up the data channels are a differential write clock conductor pair 368(0), 368(1) (WCK0_t/c, WCK1_t/c) and a differential RDQS conductor pair 370(0), 370(1) (RDQS0_t/c, RDQS1_t/c). The final data channel conductors 372(0), 372(1) (DQ0[7:0], DQ1[0:7]) provide the external conductors. In most other regards, operation of the memory device 350 is similar to the memory device 300.

Exemplary aspects of the present disclosure provide additional flexibility for scheduling bank refreshes for memory devices having any sort of architecture and these teachings apply to existing memory protocols as well as proposed protocols. Specifically, instead of the fixed spacing between banks being refreshed, exemplary aspects of the present disclosure take advantage of the fact that the application processor 104 knows to what banks read/write commands are going to be sent and can refresh banks that are not in use or not going to be in use for the duration of the refresh (e.g., the 300 ns required to refresh). The application processor 104 accordingly may send a REFpb command that identifies a first bank to be refreshed and provides additional information about at least a second bank to be refreshed. This additional information may be an explicit bank address or a number of banks skipped for the next refresh or a combination of both techniques. Examples are provided below.

Figure 4B:
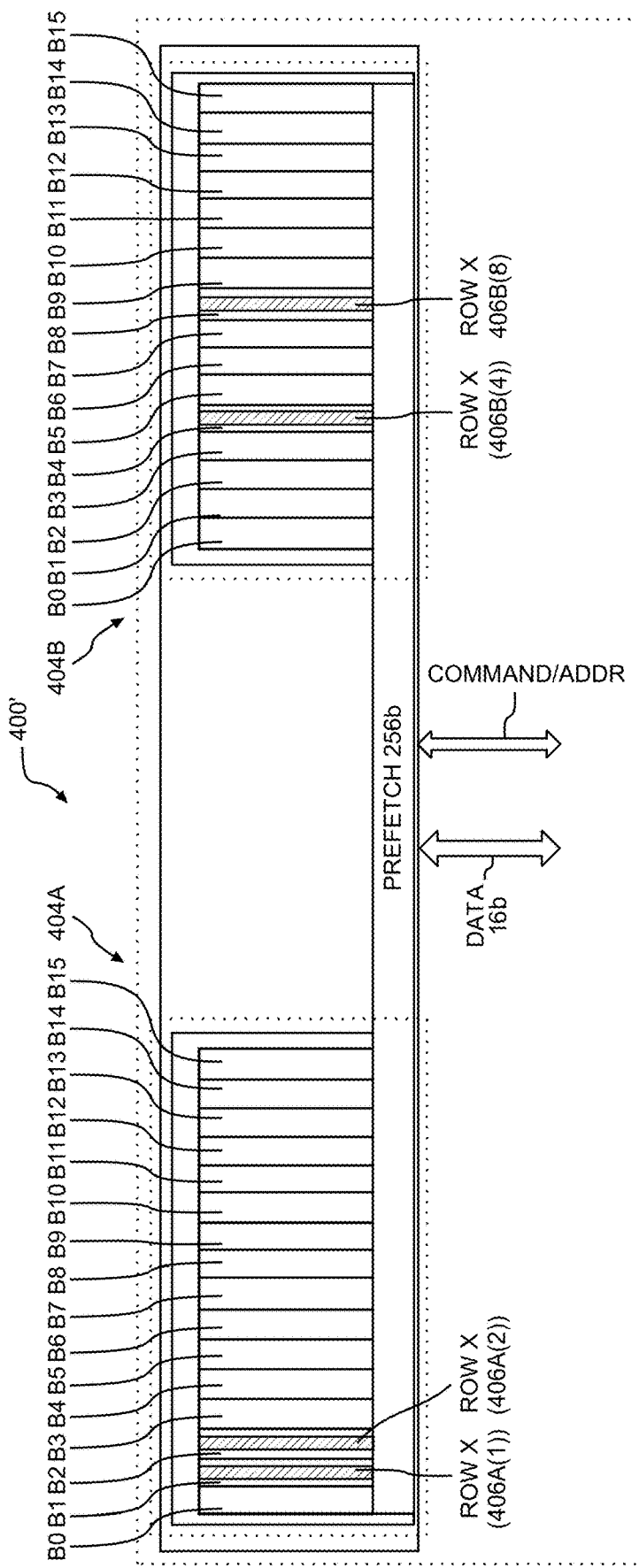
FIG. 4B is a block diagram of an exemplary aspect of a modified per bank refresh command in a two-channel memory structure according to an exemplary aspect of the present disclosure.

The end result of such flexibility is shown in FIGS. 4A and 4B. FIG. 4A corresponds to a memory device 400 operating under LPDDR5 while FIG. 4B corresponds to a memory device 400' operating under another memory configuration.

In this regard, in FIG. 4A, the memory device 400 includes banks 406(1) and 406(2) which are refreshed in a channel 404. It should be appreciated that any two banks within a group of banks 406(0)-406(15) may be chosen. In this example, the identification of the first bank to be refreshed may be bank 406(1), and the additional information may be the explicit address for bank 406(2) or a skip distance of zero (0) to identify how many banks are skipped (e.g., in this case, since the banks are adjacent, the skip distance is zero).

In an exemplary aspect, the application processor 104 may select banks to refresh based on which banks have heavy versus light traffic or no traffic. That is, since the application processor 104 knows which banks 406(0)-406(15) are going to be used and how heavy that use is going to be during a particular refresh window, the application processor 104 may select banks that are lightly used (or are not going to be used) for the refresh time (e.g., 300 ns). If one bank is in use for the entire duration of the refresh window (e.g., the 64 ms), the application processor 104 may send the refresh command to the one bank, causing traffic to that bank to stall. However, on net, such instances are likely to be few, and the occasional latency added by such conflict is generally offset by numerous instances of avoiding such stalls Similarly, FIG. 4B illustrates a memory device 400' which corresponds to an alternate memory structure. Thus, the memory device 400' includes banks 406A(1) and 406A(2) which are refreshed in a first pseudo-channel 404A while banks 406B(4) and 406B(8) are refreshed in a second pseudo-channel 404B. It should be appreciated that, effectively, any four banks within a group of banks 406A(0)-406A(15) and 406B(0)-406B(15) may be chosen. In this example, the identification of the first bank to be refreshed may be bank 406A(1), and the additional information may be the explicit address for bank 406A(2) or a skip distance of zero (0) to identify how many banks are skipped (e.g., in this case, since the banks are adjacent, the skip distance is zero). Further, the REFpb may have a second (or third) explicit address for bank 406B(4) and fourth address for bank 406B(8) or a second skip distance of three (3). Still another option would be one explicit address (e.g., bank 406A(1) and three skip distances (0:17:3)). As a further permutation of this, the skip distances may all be relative to the first address (e.g., 0:18:22). Instead of banks skipped, the additional information may be some other measurement (e.g., base address, +1, +19, +23) that effectively communicates the value of the next address without being an explicit address.

For load balancing, it may be desirable to split the banks being refreshed between the two pseudo-channels 404A, 404B. However, such is not strictly required. All four banks could be refreshed from the same pseudo-channel 404A, 404B, there could be a three-one split between the two pseudo-channels 404A, 404B, or the split could be equal as shown. In an exemplary aspect, the application processor 104 may select banks to refresh based on which banks have heavy versus light traffic or no traffic. That is, since the application processor 104 knows which banks 406A(0)-406A(15) and 406B(0)-406B(15) are going to be used and how heavy that use is going to be during a particular refresh window, the application processor 104 may select banks that are lightly used (or are not going to be used) for the refresh time (e.g., 300 ns). If one bank is in use for the entire duration of the refresh window (e.g., the 64 ms), the application processor 104 may send the refresh command to the one bank, causing traffic to that bank to stall. However, on net, such instances are likely to be few, and the occasional latency added by such conflict is generally offset by numerous instances of avoiding such stalls.

Exemplary aspects of the present disclosure provide two additional commands not previously contemplated by the LPDDR standards. These two additional commands are the quad bank refresh (REFqb) command and the octa bank refresh (REFob) command illustrated in FIGS. 5A-5B and 6A-6B, respectively.

Figure 5A:
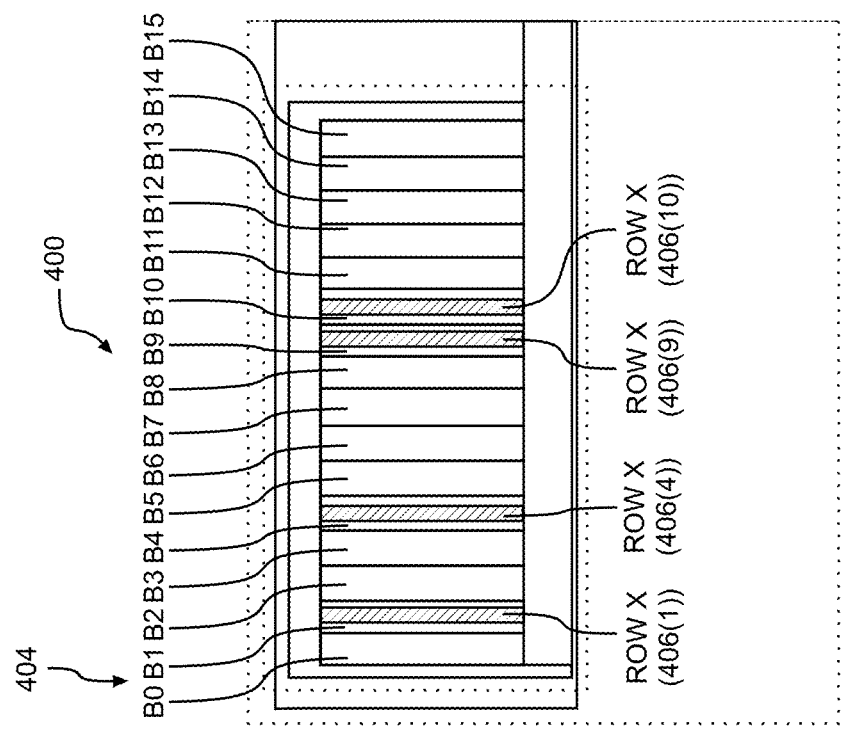
FIG. 5A is a block diagram of an exemplary aspect of a quad bank refresh command in a one-channel memory structure according to an exemplary aspect of the present disclosure.

In particular, in FIG. 5A, the memory device 400 receives a REFqb command and may refresh four banks within the channel 404. As illustrated, the banks are 406(1), 406(4), 406(9), and 406(10). It should be appreciated that any combination of four banks 406(0)-406(15) may be refreshed based on the command. Likewise, the command may have an initial explicit address and additional information (either explicit address or some form of distance from that initial address) as previously described. Still further, but not illustrated, the REFqb command may be more similar to the original REFpb command. That is, the original REFpb command had one address and knew to add eight to that address to find the second bank. Similarly, the REFqb command may have a first address and additional information about the second address, and the system knows to add eight to each of those addresses to get the third and fourth addresses within the channel.

Figure 5B:
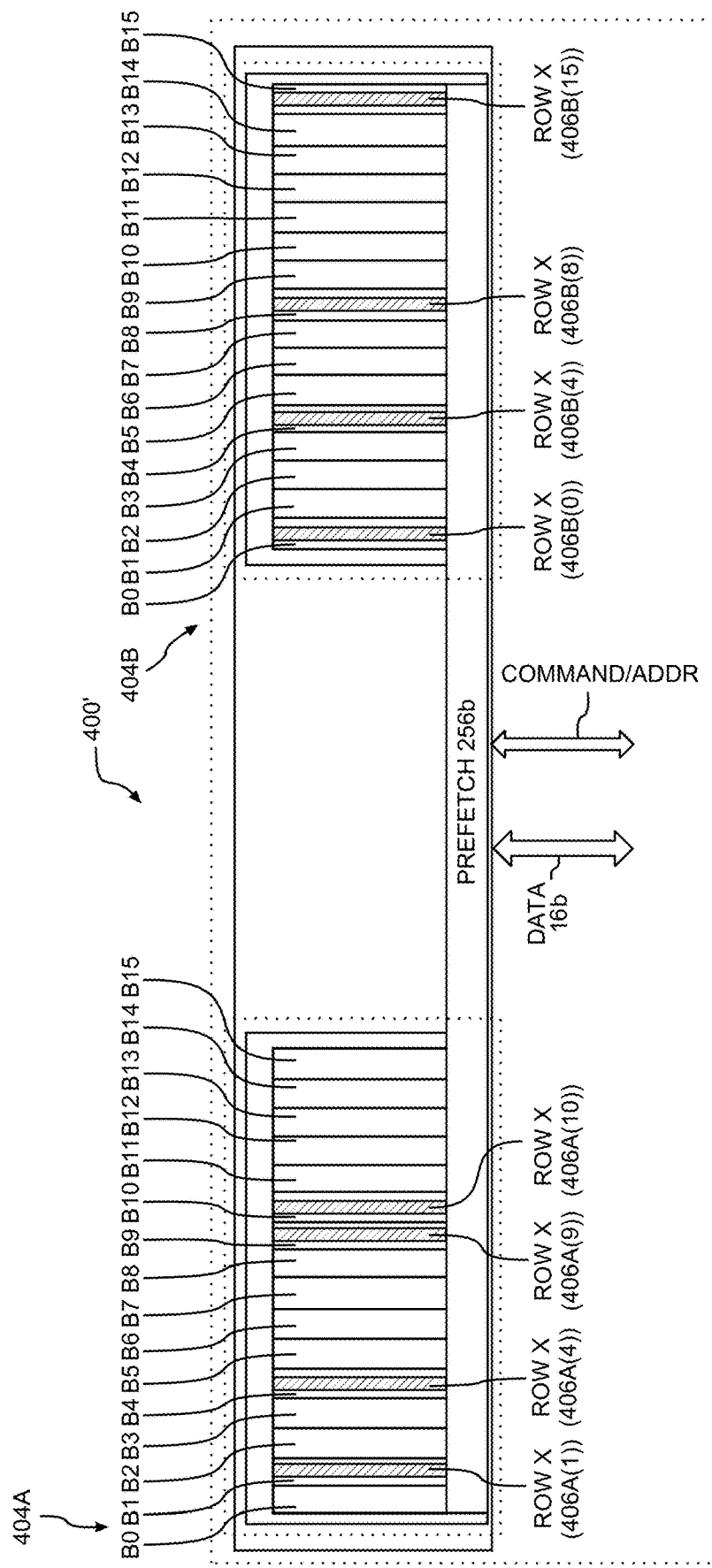
FIG. 5B is block diagram of an exemplary aspect of a quad bank refresh command in a two-channel memory structure according to an exemplary aspect of the present disclosure.

Similarly, the memory device 400' in FIG. 5B receives a REFqb command and may refresh four banks within the first pseudo-channel 404A and an additional four banks in the second pseudo-channel 404B (although such is not strictly required and any ratio between the pseudo-channels 404A, 40B may be used as needed or desired). As illustrated, the banks are 406A(1), 406A(4), 406A(9), 406A(10), 406B(0), 406B(4), 406B(8), and 406B(15). It should be appreciated that any combination of eight banks 406A(0)-406A(15) and 406B(0)-406B(15) may be refreshed based on the command. Likewise, the command may have an initial explicit address and additional information (either explicit address or some form of distance from that initial address) as previously described. Still further, but not illustrated, the REFqb command may be more similar to the original REFpb command. That is, the original REFpb command had one address and knew to add eight to that address to find the second bank. Similarly, the REFqb command may have a first address and additional information about the second address, and the system knows to add eight to each of those addresses to get the third and fourth addresses within the channel.

Figure 6A:
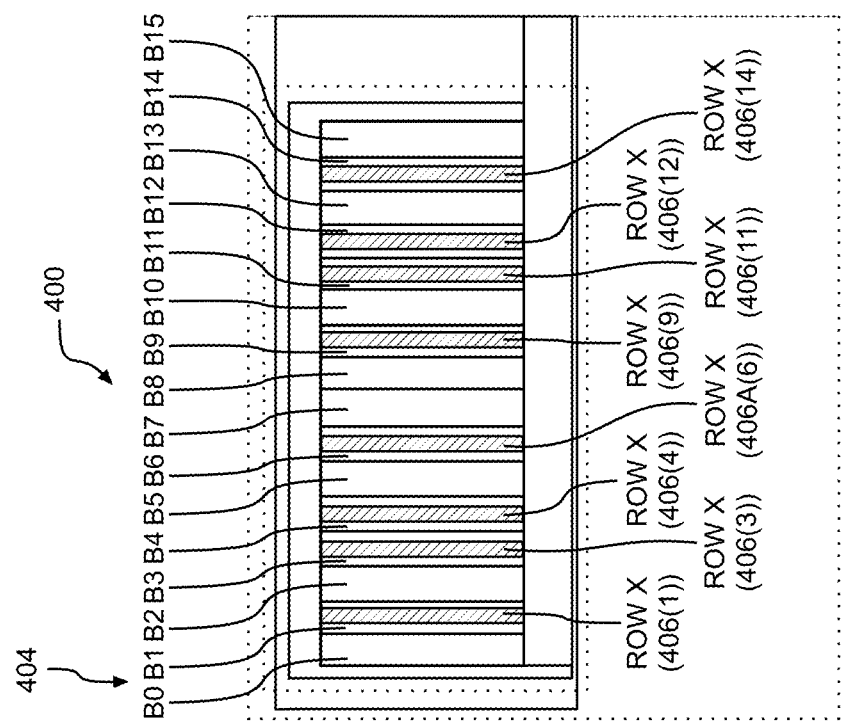
FIG. 6A is a block diagram of an exemplary aspect of an octa bank refresh command in a one-channel memory structure according to an exemplary aspect of the present disclosure.

For the octa bank refresh (REFob) command, the memory device 400 in FIG. 6A receives a REFob command and may refresh eight banks within the channel 404. As illustrated, the banks are 406(1), 406(3), 406(4), 406(6), 406(9), 406(11), 406(12), and 406(14). It should be appreciated that any combination of eight banks 406(0)-406(15) may be refreshed based on the command. Likewise, the command may have an initial explicit address and additional information (either explicit address or some form of distance from that initial address) as previously described. Still further, but not illustrated, the REFob command may be more similar to the original REFpb command. That is, the original REFpb command had one address and knew to add eight to that address to find the second bank. Similarly, the REFob command may have a first address and additional information about the second through fourth addresses, and the system knows to add eight to each of those addresses to get the fifth through eighth addresses within the channel.

Figure 6B:
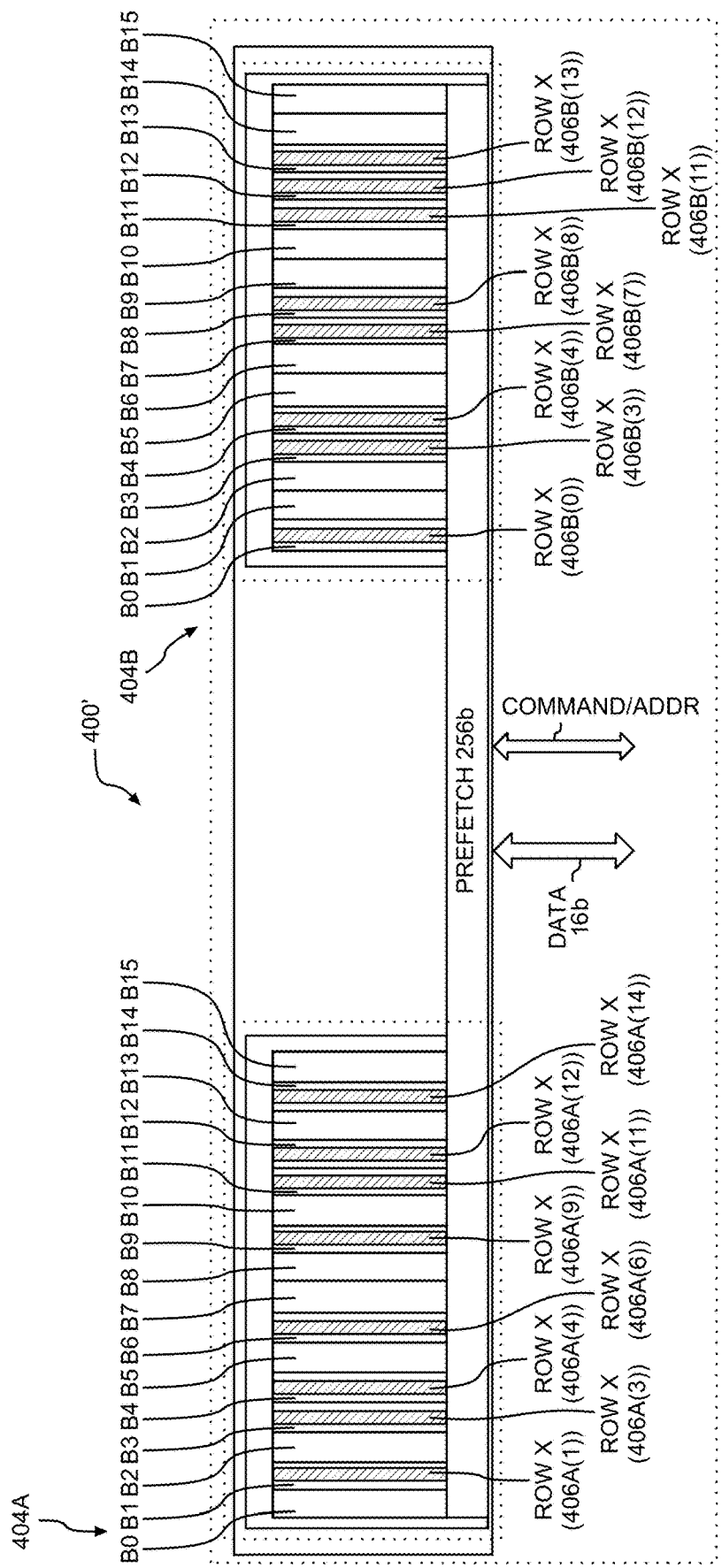
FIG. 6B is a block diagram of an exemplary aspect of an octa bank refresh command in a two-channel memory structure according to an exemplary aspect of the present disclosure.

Similarly, the memory device 400' in FIG. 6B that receives a REFob command may refresh eight banks within the first pseudo-channel 404A and an additional eight banks in the second pseudo-channel 404B (again, such is not strictly required and any ratio between the pseudo-channels 404A, 40B may be used as needed or desired). As illustrated, the banks are 406A(1), 406A(3), 406A(4), 406A(6), 406A(9), 406A(11), 406A(12), 406A(14), 406B(0), 406B(3), 406B(4), 406B(7), 406B(8), 406B(11), 406B(12) and 406B(13). It should be appreciated that any combination of sixteen banks 406A(0)-406A(15) and 406B(0)-406B(15) may be refreshed based on the command. Likewise, the command may have an initial explicit address and additional information (either explicit address or some form of distance from that initial address) as previously described. Still further, but not illustrated, the REFob command may be more similar to the original REFpb command. That is, the original REFpb command had one address and knew to add eight to that address to find the second bank. Similarly, the REFob command may have a first address and additional information about the second through fourth addresses, and the system knows to add eight to each of those addresses to get the fifth through eighth addresses within the channel.

As noted above, the application processor 104 knows which banks will be used and may craft refresh commands that do not refresh the banks being used to avoid stalling traffic. Avoiding such stalls or minimizing them to only situations where the bank must be refreshed because of the refresh window helps reduce latency and improve performance. Additionally, as potentially fewer refresh commands are being generated and sent, utilization of the CA conductors may be lower, and there may be power savings.

Figure 7:
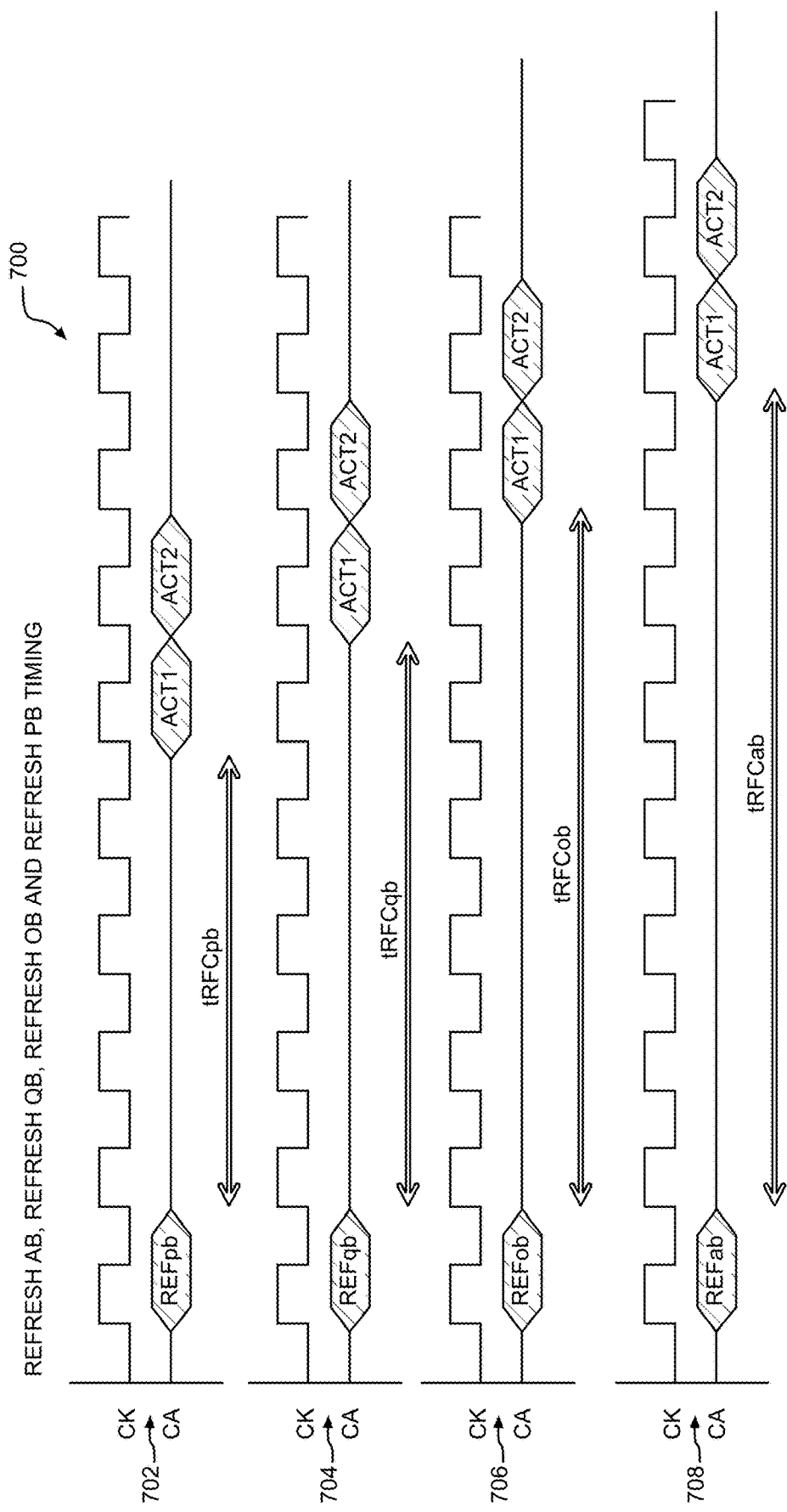
FIG. 7 is a signal diagram showing relative timing for the exemplary refresh commands introduced by the present disclosure.

FIG. 7 illustrates a signaling diagram 700 versus time showing how long the various refresh commands may take. As illustrated, line 702 may correspond to a per bank refresh (REFpb) command such as illustrated in FIG. 4. Approximately 140 ns may pass between the refresh command and the next command (activate (ACT) used as an example). Line 704 may correspond to a quad bank refresh (REFqb) command such as illustrated in FIG. 5. Approximately 200 ns may pass between the refresh command and the next command (again, ACT used as an example command). Line 706 may correspond to an octa bank refresh (REFob) command such as illustrated in FIG. 6. Approximately 240 ns may pass between the refresh command and the next command. Line 708 may correspond to an all bank refresh (REFab) command, which exists within the LPDDR5 standard and may exist in other memory standards. Approximately 280 ns may pass for the REFab command.

Figure 8:
FIG. 8 is an exemplary command truth table for an improved memory, highlighting where reserved bits may be repurposed to implement aspects of the present disclosure.

FIG. 8 provides an exemplary command truth table 800. Of interest is region 802 in the per bank refresh command. Region 802 has entries "V" which mean that the system does not care if these are logical high or logical low. In effect, these are reserved bits, which may be used to help implement the new refresh commands proposed herein as well as provide some form of encoded addressing to assist the new commands. Alternatively, some other unused bits may be used to implement aspects of the present disclosure. It should be appreciated that commands may be spread across multiple clock cycles if desired. Such may be appropriate where the addressing bits portion of the command (e.g., the first explicit address and the additional information) require additional bits beyond the few that are available in region 802.

Figure 9:
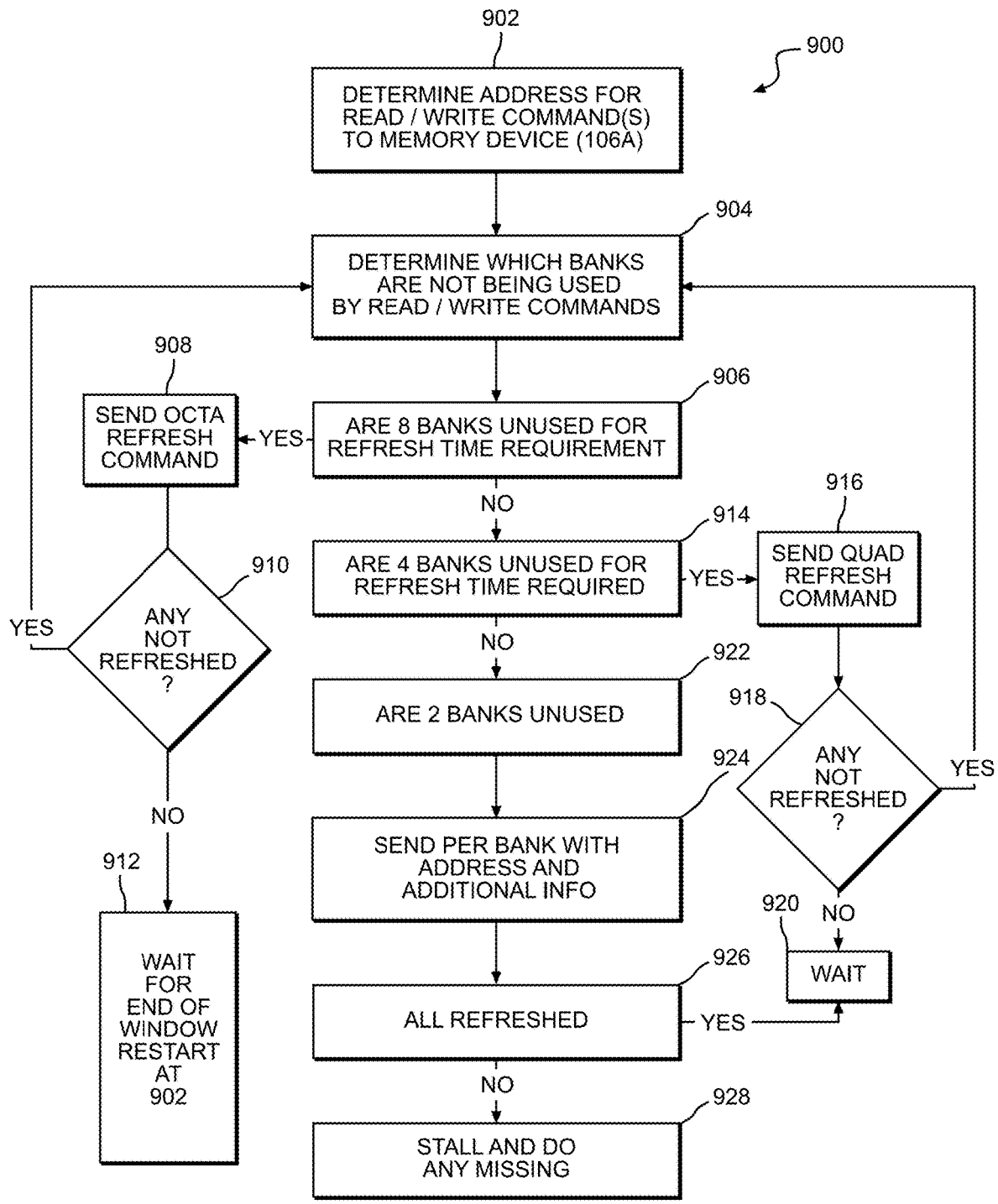
FIG. 9 is a flowchart showing an exemplary process for implementing aspects of the present disclosure.

FIG. 9 provides a flowchart of an exemplary process 900 associated with the present disclosure that implements the adaptive refresh command of the present disclosure. The process 900 begins with the application processor 104, and particularly a memory controller therewithin, determining addresses for read/write commands to the memory device 106A (block 902). Based on this determination or through some other mechanism, the memory controller may determine which banks within the memory device 106A are not being used by read/write commands (block 904). Based on the determination at block 904, the memory controller may further determine if there are eight banks (for LPDDR5 systems, sixteen for other memory configurations) that are unused for an amount of time required for a refresh (block 906). In this context, unused could be measured by an amount of traffic to those banks. In this case, the time to refresh might be, for example, the 240 ns required for an octa refresh. If there are eight unused banks at block 906, the memory controller may send an octa refresh command (block 908) for unrefreshed banks where the octa refresh command contains an address and additional information related to second through eighth (or sixteenth if using memory device 400') addresses of banks to be refreshed, and then determine if any banks have not been refreshed in this window (e.g., the 64 ms window) (block 910). If there are unrefreshed banks, the process 900 may return to block 904 to try to capture more banks to be refreshed. If, however, all the banks have been refreshed within the window, the memory controller may then wait until the end of the window to restart at block 902 (block 912).

Returning to block 906, if there are not eight banks unused (or not already refreshed), the memory controller may determine if there are four banks (for LPDDR5, eight for memory device 400') that are unused (and not already refreshed) for the amount of time required to refresh (e.g., 200 ns) (block 914). If the answer to block 914 is yes, then the memory controller may send a quad refresh command (block 916) where the quad refresh command contains an address and additional information related to second through fourth addresses of banks (or second through eighth for memory device 400') to be refreshed. The memory controller may then determine if any banks have not been refreshed (block 918). If the answer is yes, then the process 900 may return to block 904 to try to refresh remaining banks. If, however, the answer is no, all the banks have been refreshed within the window, the memory controller may then wait until the end of the window to restart at block 902 (block 920).

Returning to block 914, if there not four banks unused (or not already refreshed), the memory controller may determine if there are two banks (for LPDDR5, four for memory device 400') that are unused (and not already refreshed) for the amount of time required to refresh (e.g., 140 ns) (block 922). If the answer to block 922 is yes, then the memory controller may send a per bank refresh command (block 924) where the per bank refresh command contains an address and additional information related to the second bank (or second through fourth addresses if using memory device 400') to be refreshed. The memory controller may then determine if all banks have been refreshed (block 926). If the answer is yes, then the process 900 may pass to block 920 or 912 to wait until the end of the window to restart at block 902. If, however, there are banks remaining to be refreshed, the memory controller may stall traffic to that bank and issue a refresh command for that bank so that it is refreshed during the window (block 928). Note that "unused" in block 914 may also be some threshold of traffic, where if traffic is below that threshold, the bank is considered "unused" for the purposes of the decision at block 914. Such low-usage refreshes may cause some traffic stalling, but the amount of traffic stalled is below some acceptable threshold. Likewise, the activity at block 928 is designed as a savings measure to make sure that all rows of all banks are refreshed during the window, even if performance may be degraded temporarily.

The memory system with adaptive refresh capability according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Those of skill in the art will further appreciate that the various illustrative logical blocks, modules, circuits, and algorithms described in connection with the aspects disclosed herein may be implemented as electronic hardware, instructions stored in memory or in another computer readable medium, wherein any such instructions are executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A memory device comprising:
    a memory block; and
    a memory bus interface configured to receive a refresh command from a remote source over a memory bus, wherein the refresh command comprises:
        a first address within the memory block; and
        additional information that indicates to the memory device a second address within the memory block.
2. The memory device of clause 1, wherein the memory device complies with a low power double data rate (LPDDR) standard.
3. The memory device of clause 1 or 2, wherein the memory block comprises two pseudo-channels.
4. The memory device of clause 3, wherein each of the two pseudo channels comprises eight banks.
5. The memory device of clause 4, wherein the additional information indicates a bank adjacent to a first bank associated with the first address.
6. The memory device of clause 4, wherein the additional information indicates a bank more than seven banks away from the first address.
7. The memory device of clause 4, wherein the additional information indicates a bank less than seven banks away from the first address.
8. The memory device of any preceding clause, wherein the additional information comprises an explicit indication of the second address.
9. The memory device of any of clauses 1 to 7, wherein the additional information indicates a number of skipped banks between the first address and the second address.
10. The memory device of any of clauses 1 to 7, wherein the additional information comprises a number of banks between addresses.
11. The memory device of any preceding clause, wherein the memory bus interface is further configured to receive a quad refresh command providing a third address and further information relating to at least a fourth additional address.
12. The memory device of any preceding clause, wherein the memory bus interface is further configured to receive an octa refresh command providing a third address and further information relating to at least fourth through eighth additional addresses.
13. The memory device of any of clauses 1 or 2, wherein the memory block comprises a channel.
14. The memory device of clause 13, wherein the channel comprises sixteen banks.
15. The memory device of clause 14, wherein the additional information indicates a bank adjacent to a first bank associated with the first address.
16. The memory device of clause 14, wherein the additional information indicates a bank more than seven banks away from the first address.
17. The memory device of clause 14, wherein the additional information indicates a bank less than seven banks away from the first address.
18. A memory controller comprising:
    a bus interface configured to:
        couple to a memory bus; and
        send a refresh command to a memory device through the memory bus, wherein the refresh command comprises:
            a first address within a memory block within the memory device; and
            additional information that indicates to the memory device a second address within the memory block.
19. The memory controller of clause 18, wherein the first address is within one of two pseudo-channels within the memory device.
20. The memory controller of either of clauses 18 or 19, wherein the first address is for one of sixteen banks.
21. The memory controller of clause 20, wherein the additional information indicates a second bank adjacent to a bank associated with the first address.
22. The memory controller of any of clauses 18 through 21, wherein the additional information comprises an explicit indication of the second address.
23. The memory controller of any of clauses 18 through 22, wherein the bus interface is further configured to send a quad refresh command providing a third address and further additional information relating to at least a fourth address.
24 The memory controller of any of clauses 18 through 23, wherein the bus interface is further configured to send an octa refresh command providing a third address and further information relating to at least fourth through eighth additional addresses.
25. A memory device comprising:
    a memory block; and
    a memory bus interface configured to receive a quad refresh command from a remote source over a memory bus, wherein the quad refresh command comprises:
        a first address within the memory block; and
        additional information that indicates to the memory device second through fourth addresses within the memory block.
26. A memory device comprising:
    a memory block; and
    a memory bus interface configured to receive an octa refresh command from a remote source over a memory bus, wherein the octa refresh command comprises:
        a first address within the memory block; and
        additional information that indicates to the memory device second through eighth addresses within the memory block.
27. A memory controller comprising:
    a bus interface configured to:
        couple to a memory bus; and
        send a quad refresh command to a memory device through the memory bus, wherein the quad refresh command comprises:
            a first address within a memory block; and
            additional information that indicates to the memory device second through fourth addresses within the memory block.
28. A memory controller comprising:
    a bus interface configured to:
        couple to a memory bus; and send an octa refresh command to a memory device through the memory bus, wherein the octa refresh command comprises:
a first address within a memory block; and
additional information that indicates to the memory device second through eighth addresses within the memory block.

29. A method for a memory device to refresh memory cells, the method comprising:
receiving a refresh command through a bus interface coupled to a memory bus, wherein the refresh command comprises:
a first address within a memory block; and
additional information that indicates to the memory device a second address within the memory block.

30. A method for a memory controller to refresh memory cells, the method comprising:
sending a refresh command through a bus interface coupled to a memory bus, wherein the refresh command comprises:
a first address within a memory block; and
additional information that indicates to a memory device a second address within the memory block.

What is claimed is:

1. A memory device comprising:
a memory block; and
a memory bus interface configured to receive a refresh command from a remote source over a memory bus, wherein the refresh command comprises:
a first address within the memory block; and
additional information that indicates to the memory device a second address within the memory block, wherein the memory device is configured to refresh two memory banks in response to the refresh command, wherein the first address associates with a first of the two memory banks and the second address associates with a second of the two memory banks, and wherein the second of the two memory banks is less than seven banks away from the first of the two memory banks.

2. The memory device of claim 1, wherein the memory device complies with a low power double data rate (LPDDR) standard.

3. The memory device of claim 1, wherein the memory block comprises two pseudo-channels.

4. The memory device of claim 3, wherein each of the two pseudo channels comprises eight banks.

5. The memory device of claim 4, wherein the additional information indicates the second of the two memory banks adjacent to the first of the two memory banks.

6. The memory device of claim 1, wherein the additional information comprises an explicit indication of the second address.

7. The memory device of claim 1, wherein the additional information indicates a number of skipped banks between the first address and the second address.

8. The memory device of claim 1, wherein the additional information comprises a number of banks between addresses.

9. The memory device of claim 1, wherein the memory block comprises a channel.

10. The memory device of claim 9, wherein the channel comprises sixteen banks.

11. The memory device of claim 10, wherein the additional information indicates the second of the two memory banks adjacent to the first of the two memory banks.

12. A memory controller comprising:
a bus interface configured to:
couple to a memory bus; and
send a refresh command to a memory device through the memory bus, wherein the refresh command comprises:
a first address within a memory block within the memory device; and
additional information that indicates to the memory device a second address within the memory block, wherein the memory device is configured to refresh two memory banks in response to the refresh command, wherein the first address associates with a first of the two memory banks and the second address associates with a second of the two memory banks, and wherein the second of the two memory banks is less than seven banks away from the first of the two memory banks.

13. The memory controller of claim 12, wherein the first address is within one of two pseudo-channels within the memory device.

14. The memory controller of claim 12, wherein the first address is for one of sixteen banks.

15. The memory controller of claim 14, wherein the second of the two memory banks adjacent to the first of the two memory banks.

16. The memory controller of claim 12, wherein the additional information comprises an explicit indication of the second address.

17. A memory device comprising:
a memory block; and
a memory bus interface configured to receive a quad refresh command from a remote source over a memory bus, wherein the quad refresh command comprises:
a first address within the memory block; and
additional information that indicates to the memory device second through fourth addresses within the memory block, wherein the memory device is configured to refresh four memory banks in response to the refresh command, wherein the first address associates with a first of the four memory banks, the second address associates with a second of the four memory banks, the third address associates with a third of the four memory banks, and the fourth address associates with a fourth of the four memory banks.

* * * * *